(12) United States Patent
Yoon et al.

(10) Patent No.: US 11,176,870 B2
(45) Date of Patent: Nov. 16, 2021

(54) DISPLAY APPARATUS HAVING GATE DRIVING CIRCUIT

(71) Applicant: Samsung Display Co., Ltd., Yongin-si (KR)

(72) Inventors: Soo-wan Yoon, Hwaseong-si (KR); Joon-chul Goh, Hwaseong-si (KR); Young-Soo Yoon, Seoul (KR); Bonghyun You, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/206,950

(22) Filed: Nov. 30, 2018

(65) Prior Publication Data

US 2019/0096314 A1    Mar. 28, 2019

Related U.S. Application Data

(62) Division of application No. 14/977,148, filed on Dec. 21, 2015, now Pat. No. 10,152,910.

(30) Foreign Application Priority Data

Jan. 29, 2015    (KR) ........................ 10-2015-0014562

(51) Int. Cl.
*G09G 3/20* (2006.01)
*G09G 3/36* (2006.01)
*G11C 19/28* (2006.01)

(52) U.S. Cl.
CPC ......... *G09G 3/2092* (2013.01); *G09G 3/3677* (2013.01); *G09G 3/3696* (2013.01);
(Continued)

(58) Field of Classification Search
CPC ................. G09G 3/3674–3681; G09G 3/2092
See application file for complete search history.

(56) References Cited

U.S. PATENT DOCUMENTS 8,139,006 B2    3/2012 Ryu et al.
8,242,496 B2    8/2012 Yamazaki et al.
(Continued)

FOREIGN PATENT DOCUMENTS

CN    102484471 A    5/2012
CN    103208262 A    7/2013
(Continued)

OTHER PUBLICATIONS

EPO Search Report dated Jun. 6, 2016, for corresponding European Patent application 16152732.0 (8 pages).
(Continued)

*Primary Examiner* — Hang Lin
(74) *Attorney, Agent, or Firm* — Lewis Roca Rothgerber Christie LLP

(57) ABSTRACT

A display apparatus includes: a display panel including a plurality of pixels respectively connected to a plurality of gate lines; a gate driving circuit including a plurality of driving stages configured to apply gate signals to the gate lines; a voltage generator configured to output a gate-on voltage through a voltage output terminal thereof; and a signal controller configured to sense a variation in current of the voltage output terminal to output a back bias control voltage corresponding to the sensed current variation, wherein each of the driving stages comprises a plurality of oxide thin film transistors and at least one of the oxide thin film transistors is a four-terminal transistor in which a threshold voltage thereof is controlled by the back bias control voltage.

14 Claims, 13 Drawing Sheets

(52) U.S. Cl.
CPC ... *G11C 19/287* (2013.01); *G09G 2300/0426* (2013.01); *G09G 2300/0861* (2013.01); *G09G 2310/0286* (2013.01); *G09G 2310/08* (2013.01); *G09G 2320/041* (2013.01); *G09G 2330/025* (2013.01)

(56) References Cited

U.S. PATENT DOCUMENTS

| | | | |
|---|---|---|---|
| 8,395,157 | B2 | 3/2013 | Park et al. |
| 8,587,347 | B2 | 11/2013 | Yoon et al. |
| 8,744,038 | B2 | 6/2014 | Hirose |
| 8,988,407 | B2 | 3/2015 | Han et al. |
| 9,589,519 | B2 | 3/2017 | Hwang et al. |
| 9,905,311 | B2 | 2/2018 | Ogawa et al. |
| 2002/0186191 | A1* | 12/2002 | Ikeda ............... G09G 3/3648 345/87 |
| 2006/0274021 | A1 | 12/2006 | Park et al. |
| 2009/0027375 | A1 | 1/2009 | Ryu et al. |
| 2009/0278832 | A1* | 11/2009 | Cho ............... G09G 3/3648 345/211 |
| 2011/0102409 | A1* | 5/2011 | Hayakawa ....... H01L 27/1225 345/212 |
| 2014/0267214 | A1 | 9/2014 | Hwang et al. |
| 2016/0165160 | A1* | 6/2016 | Hseih ............... H04N 5/3765 348/308 |
| 2017/0140698 | A1 | 5/2017 | Hwang et al. |

FOREIGN PATENT DOCUMENTS

| | | |
|---|---|---|
| JP | 2006-174294 A | 6/2006 |
| JP | 2006-343746 A | 12/2006 |
| JP | 2011-40726 A | 2/2011 |
| JP | 2011-120221 A | 6/2011 |
| JP | 2013-84333 A | 5/2013 |
| JP | 2014-41333 A | 3/2014 |
| KR | 10-2006-0134758 A | 12/2006 |
| KR | 10-2009-0011752 A | 2/2009 |
| KR | 10-2012-0011966 A | 2/2012 |
| KR | 10-2012-0120707 A | 11/2012 |
| KR | 10-2014-0041047 A | 4/2014 |
| KR | 10-2014-0042451 A | 4/2014 |
| KR | 10-2014-0096613 A | 8/2014 |
| KR | 10-2014-0112290 A | 9/2014 |
| WO | 2014/141800 A1 | 9/2014 |

OTHER PUBLICATIONS

EPO Extended Search Report dated Sep. 20, 2016, for corresponding European Patent Application No. 16152732.0 16 (pages).

\* cited by examiner

DISPLAY APPARATUS HAVING GATE DRIVING CIRCUIT

CROSS-REFERENCE TO RELATED APPLICATION

This application is a divisional of U.S. patent application Ser. No. 14/977,148, filed Dec. 21, 2015, which claims priority to and the benefit of Korean Patent Application No. 10-2015-0014562, filed Jan. 29, 2015, the entire content of both of which is incorporated herein by reference.

BACKGROUND

1. Field

Aspects of embodiments of the present invention relate to a display apparatus having a gate driving circuit integrated in a display panel thereof.

2. Description of the Related Art

A display apparatus includes gate lines, data lines, and pixels connected to the gate lines and the data lines. The display apparatus includes a gate driving circuit to apply gate signals to the gate lines and a data driving circuit to apply data signals to the data lines.

The gate driving circuit includes a shift register including driving stage circuits (hereinafter, referred to as driving stages). Each driving stage applies a corresponding gate signal of the gate signals to a corresponding gate line of the gate lines. Each driving stage includes transistors connected to each other.

The above information disclosed in this Background section is only for enhancement of understanding of the background of the invention and therefore it may contain information that does not constitute prior art.

SUMMARY

One or more aspects of embodiments of the present invention are directed toward a display apparatus capable of improving reliability of a gate driving circuit thereof.

According some embodiments of the present invention, a display apparatus includes: a display panel including a plurality of pixels respectively connected to a plurality of gate lines; a gate driving circuit including a plurality of driving stages configured to apply gate signals to the gate lines; a voltage generator configured to output a gate-on voltage through a voltage output terminal thereof; and a signal controller configured to sense a variation in current of the voltage output terminal to output a back bias control voltage corresponding to the sensed current variation, wherein each of the driving stages includes a plurality of oxide thin film transistors and at least one of the oxide thin film transistors is a four-terminal transistor in which a threshold voltage thereof is controlled by the back bias control voltage.

The display apparatus may further include a clock generator configured to receive the gate-on voltage and to apply at least one clock signal and at least one low-level voltage to the gate driving circuit.

The gate driving circuit may further include: a back bias voltage signal line configured to transmit the back bias control voltage to each of the driving stages; a clock signal line configured to apply the at least one clock signal to each of the driving stages; and a low-level voltage line configured to transmit the at least one low-level voltage to each of the driving stages.

The driving stages may be configured to output the gate signals in response to the back bias control voltage, the at least one clock signal, and the at least one low-level voltage.

A k-th (k is a natural number equal to or greater than 2) driving stage of the driving stages may include: a first output transistor including a control electrode configured to receive an output control signal of a first node, an input electrode configured to receive the at least one clock signal, and an output electrode configured to output a k-th gate signal; a second output transistor including a control electrode configured to receive the output control signal of the first node, an input electrode configured to receive the at least one clock signal, and an output electrode configured to output a k-th carry signal; and a controller configured to output the output control signal to the first node in response to the at least one clock signal, a (k−1)th carry signal output from a (k−1)th driving stage, and a (k+1)th carry signal output from a (k+1)th driving stage.

At least one of the first and second output transistors may be the four-terminal transistor in which the threshold voltage thereof is controlled according to the back bias control voltage.

The k-th driving stage may further include: a first pull-down part between the output electrode of the first output transistor and the at least one low-level voltage and configured to pull-down the output electrode of the first output transistor to the at least one low-level voltage in response to a pull-down control signal of a second and the (k+1)th carry signal output from the (k+1)th driving stage; and a second pull-down part between the output electrode of the second output transistor and the at least one low-level voltage and configured to pull-down the output electrode of the second output transistor to the at least one low-level voltage in response to the pull-down control signal of the second and the (k+1)th carry signal output from the (k+1)th driving stage, wherein the controller is configured to apply the pull-down control signal to a second node.

The at least one low-level voltage output from the clock generator may include a first low-level voltage and a second low-level voltage, the first pull-down part may be between the output electrode of the first output transistor and the first low-level voltage, and the second pull-down part may be between the output electrode of the second output transistor and the second low-level voltage.

The first and second low-level voltages may have different voltage levels from each other.

The controller may include: a fifth transistor between the at least one clock signal and a third node and comprising a control electrode configured to receive the at least one clock signal; a sixth transistor between the at least one clock signal and the output terminal of the second transistor and including a control electrode connected to the third node; a seventh transistor between the third node and the second low-level voltage and include a control electrode connected to the output electrode of the second transistor; and an eighth transistor between the second node and the second low-level voltage and including a control electrode connected to the output electrode of the second transistor.

At least one of the seventh and eighth transistors may be the four-terminal transistor in which the threshold voltage thereof is controlled by the back bias control voltage.

The controller may further include: a third transistor between the (k−1)th carry signal output from the (k−1)th stage and the first node and including a control electrode configured to receive the (k−1)th carry signal; and a fourth transistor between the first node and the second low-level voltage and including a control electrode configured to receive the (k+1)th carry signal output from the (k+1)th stage.

The first pull-down part may include: a tenth transistor between the output electrode of the first output transistor and the first low-level voltage and comprising a control electrode configured to receive the pull-down control signal of the second node; and an eleventh transistor between the output electrode of the first output transistor and the first low-level voltage and comprising a control electrode configured to receive the (k+1)th carry signal output from the (k+1)th stage.

The second pull-down part may include: a twelfth transistor between the output electrode of the second output transistor and the at least one low-level voltage and comprising a control electrode configured to receive the pull-down control signal of the second node; and a thirteenth transistor between the output electrode of the second output transistor and the at least one low-level voltage and comprising a control electrode configured to receive the (k+1)th carry signal output from the (k+1)th stage.

The signal controller may include: a current sensor configured to sense the current variation of the voltage output terminal to output a sensing voltage corresponding to the sensed current variation; an analog-to-digital converter configured to convert the sensing voltage to a digital sensing signal; a timing controller configured to output a bias voltage signal in response to the digital sensing signal; a digital-to-analog converter configured to convert the bias voltage signal to an analog bias voltage signal; and an output amplifier configured to convert the analog bias voltage signal to the back bias control voltage.

The timing controller may be further configured to output a sensing control signal, which is periodically activated, and the current sensor may be configured to output the sensing voltage in synchronization with the sensing control signal.

The timing controller may be configured to output the bias voltage signal in response to the digital sensing signal applied thereto when a predetermined time elapses after the sensing control signal.

According to some example embodiments of the present invention, a display apparatus includes: a display panel including a plurality of pixels respectively connected to a plurality of gate lines; a voltage generator configured to output a gate-on voltage through a voltage output terminal thereof; a clock generator configured to receive the gate-on voltage and comprising a clock output terminal configured to output at least one clock signal and a first low-level voltage output terminal configured to output a first low-level voltage; a gate driving circuit comprising a plurality of driving stages each configured to receive the at least one clock signal and the first low-level voltage to apply gate signals to the gate lines; and a signal controller configured to sense a variation in current of the first low-level voltage output terminal and configured to output a back bias control voltage corresponding to the sensed current variation, wherein each of the driving stages comprises a plurality of oxide thin film transistors and at least one of the oxide thin film transistors is a four-terminal transistor in which a threshold voltage thereof is controlled by the back bias control voltage.

The signal controller may include: a current sensor configured to sense the current variation of the low-level voltage output terminal and to output a sensing voltage corresponding to the sensed current variation; an analog-to-digital converter configured to convert the sensing voltage to a digital sensing signal; a timing controller configured to output a bias voltage signal in response to the digital sensing signal; a digital-to-analog converter configured to convert the bias voltage signal to an analog bias voltage signal; and an output amplifier configured to convert the analog bias voltage signal to the back bias control voltage.

The timing controller may be further configured to output a sensing control signal, which is periodically activated, and the current sensor may be configured to output the sensing voltage in synchronization with the sensing control signal.

The timing controller may be configured to output a bias voltage signal in response to the digital sensing signal applied thereto when a predetermined time elapses after the sensing control signal.

According to the above and according to some embodiments, when the threshold voltage of the transistors included in the gate driving circuit is shifted, the level of the back bias control voltage applied to the back gate electrode may be controlled. Because the level of the threshold voltage of the transistors may be set to a desired level by controlling the level of the back bias control voltage applied to the back gate electrode of the transistors, the reliability of the gate driving circuit may be improved.

BRIEF DESCRIPTION OF THE DRAWINGS

The above and other aspects of the present invention will become more readily apparent by reference to the following detailed description when considered in conjunction with the accompanying drawings wherein.

DETAILED DESCRIPTION

Figure 1:
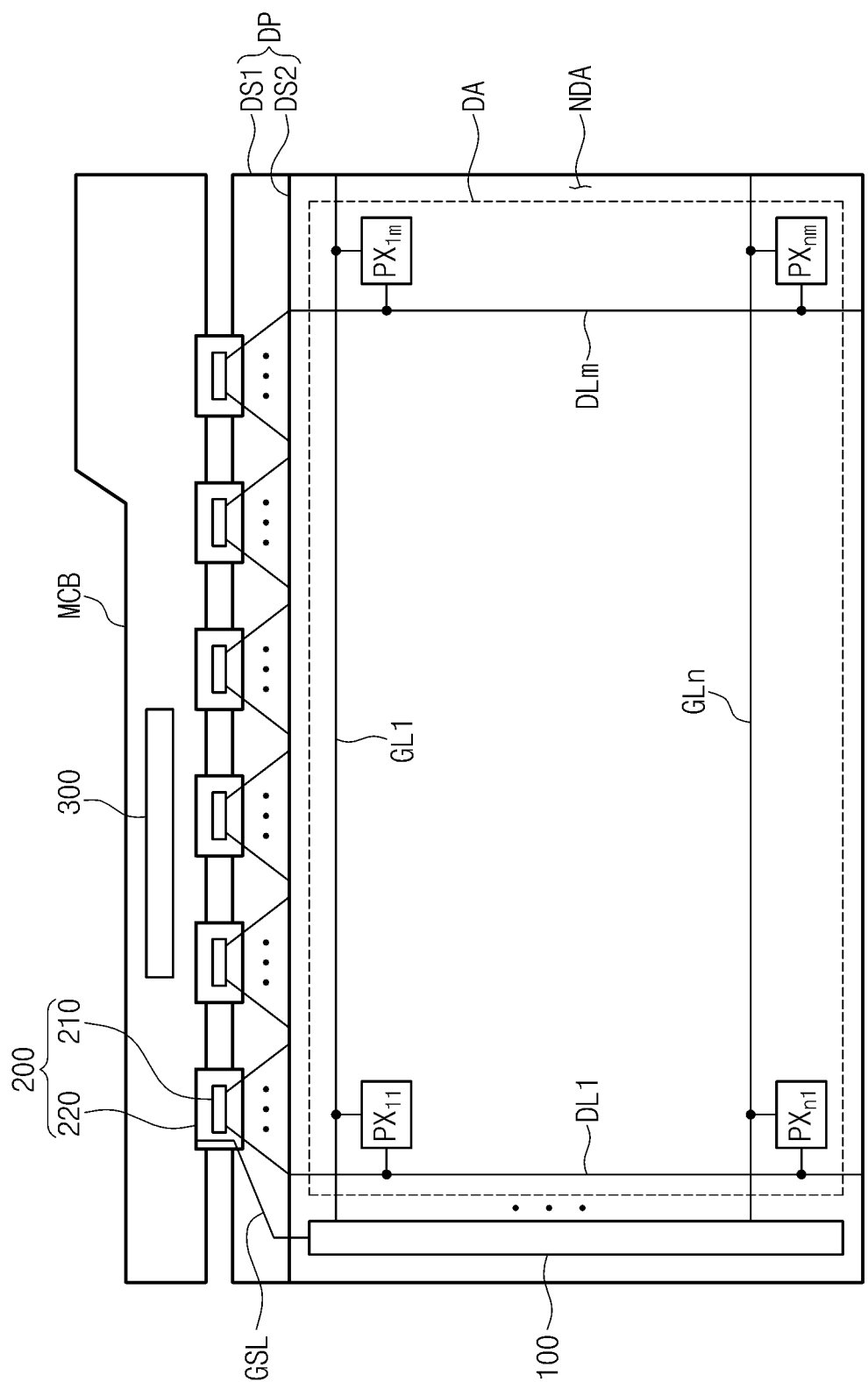
FIG. 1 is a plan view showing a display apparatus according to an example embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Expressions such as "at least one of" or "at least one selected from" when preceding a list of elements, modify the entire list of elements and do not modify the individual elements of the list.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of example embodiments of the present invention will be explained in more detail with reference to the accompanying drawings.

Figure 2:
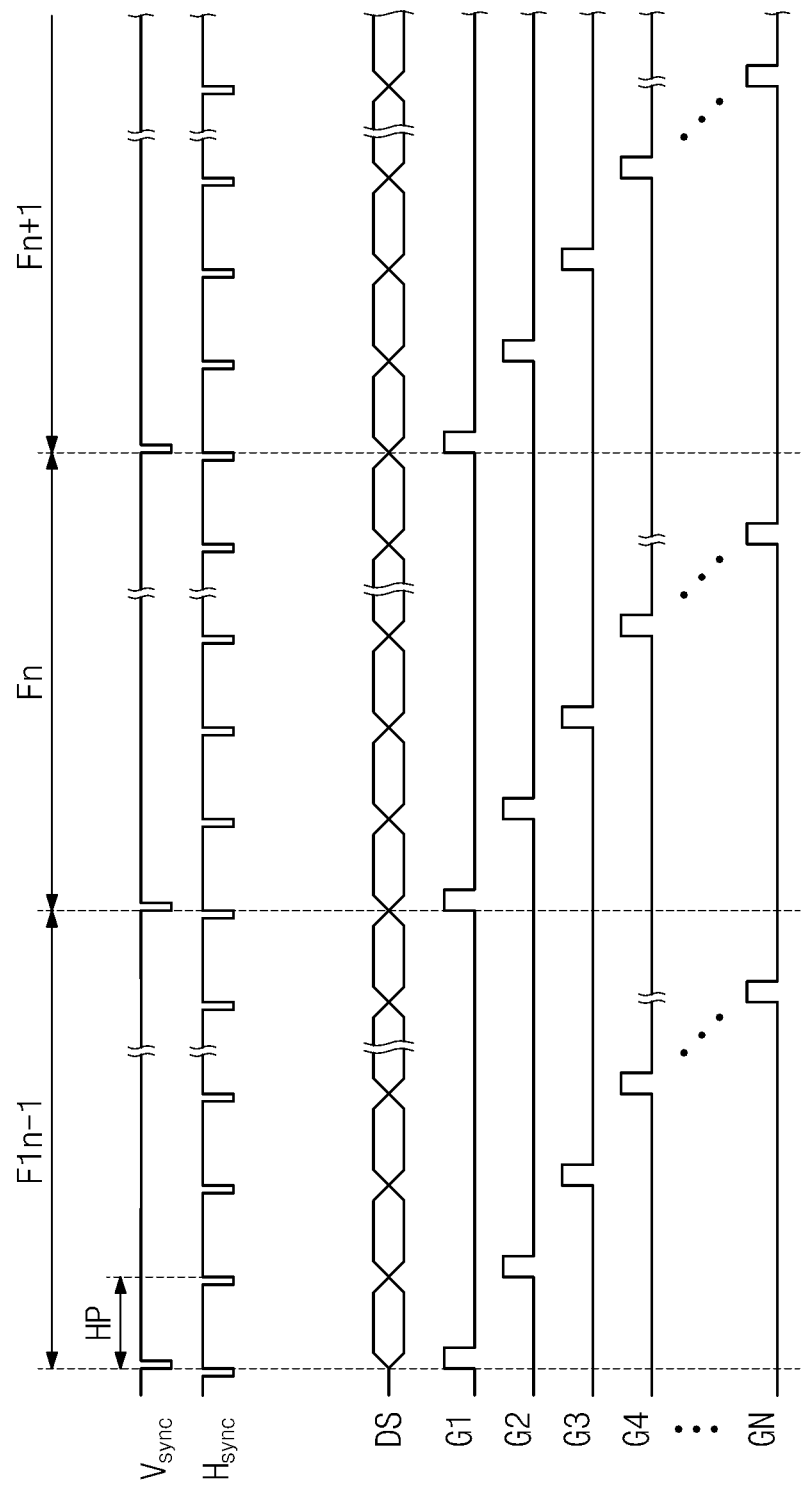
FIG. 2 is a timing diagram showing signals of a display apparatus according to an example embodiment of the present invention.

FIG. 1 is a plan view showing a display apparatus according to an example embodiment of the present invention and FIG. 2 is a timing diagram showing signals of a display apparatus according to an example embodiment of the present invention.

Referring to FIGS. 1 and 2, the display apparatus includes a display panel DP, a gate driving circuit 100, a data driving circuit 200, and a driving controller 300.

The display panel DP may be various display panels, such as a liquid crystal display panel, an organic light emitting display panel, an electrophoretic display panel, an electrowetting display panel, etc. In the present example embodiment, the liquid crystal display panel will be described as the display panel DP, but embodiments of the present invention are not limited thereto. Meanwhile, the liquid crystal display apparatus including the liquid crystal display panel may further include a polarizer and a backlight unit.

The display panel DP includes a first substrate DS1, a second substrate DS2 spaced apart from the first substrate DS1, and a liquid crystal layer arranged between the first and second substrates DS1 and DS2. The display panel DP includes a display area DA in which a plurality of pixels $PX_{11}$ to $PX_{nm}$ is disposed and a non-display area NDA surrounding (e.g., outside a footprint or periphery of) the display area DA when viewed in a plan view.

The display panel DP includes a plurality of gate lines GL1 to GLn disposed on the first substrate DS1 and a plurality of data lines DL1 to DLm crossing the gate lines GL1 on the first substrate DS1. The gate lines GL1 to GLn are connected to the gate driving circuit 100. The data lines DL1 to DLm are connected to the data driving circuit 200. FIG. 1 shows a portion of the gate lines GL1 to GLn and a portion of the data lines DL1 to DLm.

FIG. 1 shows a portion of the pixels $PX_{11}$ to $PX_{nm}$. Each of the pixels $PX_{11}$ to $PX_{nm}$ is connected to a corresponding gate line of the gate lines GL1 to GLn and a corresponding data line of the data lines DL1 to DLm.

The pixels $PX_{11}$ to $PX_{nm}$ are grouped into a plurality of groups according to colors displayed thereby. Each of the pixels $PX_{11}$ to $PX_{nm}$ displays one of primary colors. The primary colors may include, but are not limited to, a red color, a green color, a blue color, and a white color. The primary colors may further include various other colors, such as yellow, cyan, magenta, etc.

The gate driving circuit 100 and the data driving circuit 200 receive control signals from a driving controller 300. The driving controller 300 is mounted on a main circuit board MCB. The driving controller 300 receives image data and control signals from an external graphic controller. The control signals include a vertical synchronization signal Vsync serving as a signal to distinct frame periods Fn−1, Fn, and Fn+1, a horizontal synchronization signal Hsync serving as a row distinction signal to distinct horizontal periods HP, a data enable signal maintained at a high level during a period, in which data are output, to indicate a data input period, and clock signals.

The gate driving circuit 100 generates gate signals G1 to Gn in response to the control signal (hereinafter, referred to as a gate control signal) provided from the driving controller 300 during the frame periods Fn−1, Fn, and Fn+1 and applies the gate signals G1 to Gn to the gate lines GL1 to GLn. The gate signals G1 to Gn are sequentially output to correspond to the horizontal periods HP. The gate driving circuit 100 may be substantially simultaneously (e.g., concurrently) formed together with the pixels $PX_{11}$ to $PX_{nm}$ through a thin film process. For instance, the gate driving circuit 100 may be mounted on the non-display area NDA in an oxide semiconductor TFT gate driver circuit (OSG) form.

FIG. 1 shows one gate driving circuit 100 connected to left ends of the gate lines GL1 to GLn as a representative example. However, the display device according to the present example embodiment may include two gate driving circuits. One gate driving circuit of the two gate driving circuits is connected to the left ends of the gate lines GL1 to GLn and the other gate driving circuit of the two gate driving circuits is connected to right ends of the gate lines GL1 to GLn. In addition, one gate driving circuit of the two gate driving circuits is connected to odd-numbered gate lines of the gate lines GL1 to GLn and the other gate driving circuit of the two gate driving circuits is connected to even-numbered gate lines of the gate lines GL1 to GLn.

The data driving circuit 200 generates grayscale voltages corresponding to the image data provided from the driving controller 300 in response to the control signal (hereinafter, referred to as a data signal) provided from the driving controller 300. The data driving circuit 200 applies the grayscale voltages to the data lines DL1 to DLm as data voltages DS.

The data voltages DS include positive (+) data voltages having a positive polarity with respect to a common voltage and/or negative (−) data voltage having a negative polarity with respect to the common voltage. A portion of the data voltages applied to the data lines DL1 to DLm during each horizontal period HP has the positive polarity and the other portion of the data voltages applied to the data lines DL1 to DLm during each horizontal period HP has the negative polarity. The polarity of the data voltages DS is inverted according to the frame periods Fn−1, Fn, and Fn+1 to prevent liquid crystals from burning and deteriorating. The data driving circuit 200 generates the data voltages inverted in the unit of frame period in response to an inversion signal.

The data driving circuit 200 includes a driving chip 210 and a flexible circuit board 220 on which the driving chip 210 is mounted. Each of the driving chip 210 and the flexible circuit board 220 may be provided in a plural number. The flexible circuit board 220 electrically connects the main circuit board MCB and the first substrate DS1. Each of the driving chips 210 applies a corresponding data voltage of the data voltages to a corresponding data line of the data lines DL1 to DLm.

In FIG. 1, the data driving circuit 200 is provided in a tape carrier package (TCP) configuration, but it should not be limited thereto or thereby. That is, the data driving circuit 200 may be mounted on the first substrate DS1 in a chip-on-glass (COG) configuration to correspond to the non-display area NDA.

Figure 3:
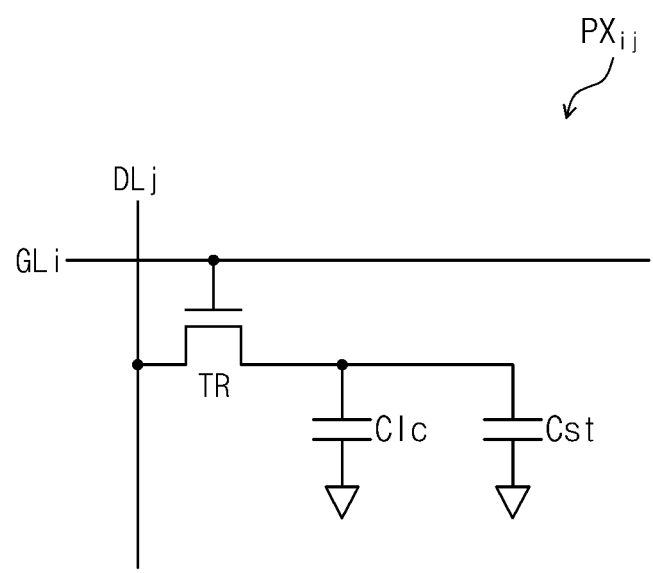
FIG. 3 is an equivalent circuit diagram showing a pixel according to an example embodiment of the present invention.
Figure 4:
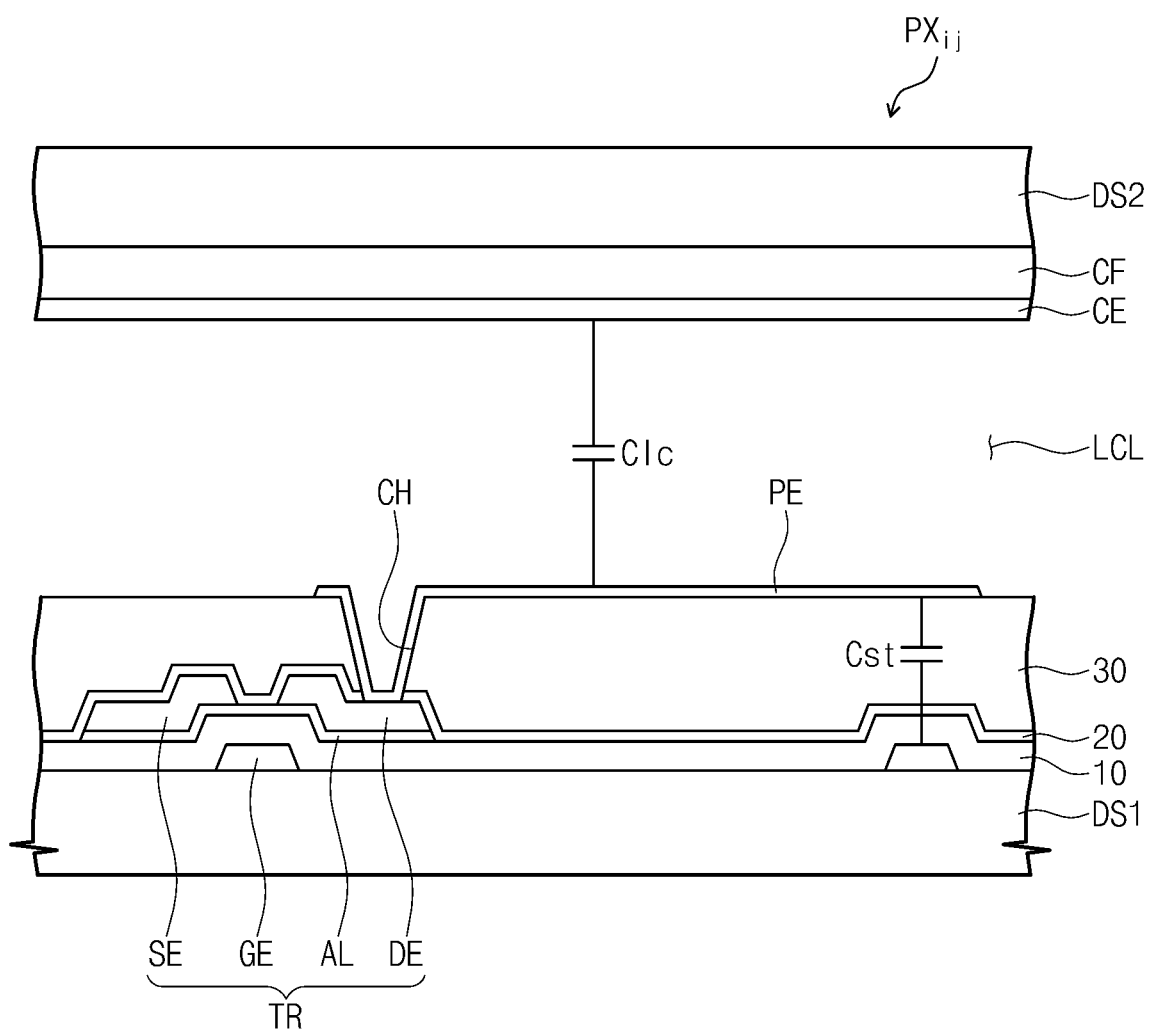
FIG. 4 is a cross-sectional view showing a pixel according to an example embodiment of the present invention.

FIG. 3 is an equivalent circuit diagram showing a pixel according to an example embodiment of the present invention, and FIG. 4 is a cross-sectional view showing a pixel according to an example embodiment of the present invention. Each of the pixels $PX_{11}$ to $PX_{nm}$ shown in FIG. 1 may have substantially the same equivalent circuit diagram shown in FIG. 3.

Referring to FIG. 3, the pixel PXij includes a pixel thin film transistor TR (hereinafter, referred to as a pixel transistor), a liquid crystal capacitor Clc, and a storage capacitor Cst. Hereinafter, in some embodiments, a "transistor" refers to a thin film transistor, and the storage capacitor Cst may be omitted.

The pixel transistor TR is electrically connected to an i-th gate line GLi and a j-th data line DLj. The pixel transistor TR outputs a pixel voltage corresponding to the data signal provided from the j-th data line DLj in response to the gate signal provided from the i-th gate line GLi.

The liquid crystal capacitor Clc is charged with the pixel voltage output from the pixel transistor TR. An alignment of liquid crystal directors included in the liquid crystal layer LCL (refer to FIG. 4) is changed in accordance with an amount of electric charges charged in the liquid crystal capacitor Clc. A light incident to the liquid crystal layer LCL transmits through or is blocked by the alignment of the liquid crystal directors.

The storage capacitor Cst is connected to the liquid crystal capacitor Clc in parallel. The storage capacitor Cst maintains the alignment of the liquid crystal directors for a period (e.g., a predetermined period).

Referring to FIG. 4, the pixel transistor TR includes a control electrode GE connected to the i-th gate line GLi (refer to FIG. 3), an active part AL overlapped with the control electrode GE, an input electrode SE connected to the j-th data line DLj (refer to FIG. 3), and an output electrode DE disposed to be spaced apart from the input electrode SE.

The liquid crystal capacitor Clc includes a pixel electrode PE and a common electrode CE. The storage capacitor Cst includes the pixel electrode PE and a portion of a storage line STL overlapped with the pixel electrode PE.

The i-th gate line GLi and the storage line STL are arranged on a surface of the first substrate DS1. The control electrode GE is branched from the i-th gate line GLi. The i-th gate line GLi and the storage line STL include a metal material, such as aluminum (Al), silver (Ag), copper (Cu), molybdenum (Mo), chromium (Cr), tantalum (Ta), titanium (Ti), or an alloy thereof. Each of the i-th gate line GLi and the storage line STL has a multi-layer structure of a titanium layer and a copper layer.

A first insulating layer 10 is arranged on the first substrate DS1 to cover the control electrode GE and the storage line STL. The first insulating layer 10 includes at least one of an inorganic material and an organic material. The first insulating layer 10 is an organic or inorganic layer. The first insulating layer 10 has a multi-layer structure of a silicon nitride layer and a silicon oxide layer.

The active part AL is arranged on the first insulating layer 10 to overlap with the control electrode GE. The active part AL includes a semiconductor layer and an ohmic contact layer. The semiconductor layer is arranged on the first insulating layer 10, and the ohmic contact layer is arranged on the semiconductor layer.

The output electrode DE and the input electrode SE are arranged on the active part AL. The output electrode DE and the input electrode SE are spaced apart from each other. Each of the output electrode DE and the input electrode SE is partially overlapped with the control electrode GE.

A second insulating layer 20 is arranged on the first insulating layer 10 to cover the active part AL, the output electrode DE, and the input electrode SE. The second insulating layer 20 includes an inorganic or organic material. The second insulating layer 20 is an organic or inorganic layer. The second insulating layer 20 has a multi-layer structure of a silicon nitride layer and a silicon oxide layer.

FIG. 1 shows the pixel transistor TR having a staggered structure, but the structure of the pixel transistor TR should not be limited to the staggered structure. That is, the pixel transistor TR may have a planar structure.

A third insulating layer 30 is arranged on the second insulating layer 20. The third insulating layer 30 provides an evenness (e.g., smooth, level, or planar) surface. The third insulating layer 30 includes an organic material.

The pixel electrode PE is arranged on the third insulating layer 30. The pixel electrode PE is connected to the output electrode DE through a contact hole CH formed through the second and third insulating layer 20 and 30. An alignment layer may be arranged on the third insulating layer 30 to cover the pixel electrode PE.

A color filter layer CF is arranged on a surface of the second substrate DS2. The common electrode CE is arranged on the color filter layer CF. The common electrode CE is applied with a common voltage. The common voltage has a level different from that of the pixel voltage. An alignment layer may be arranged on the common electrode CE to cover the common electrode CE. Another insulating layer may be arranged between the color filter layer CF and the common electrode CE.

The pixel electrode PE and the common electrode CE, which face each other such that the liquid crystal layer LCL is arranged between the pixel electrode PE and the common electrode CE, form the liquid crystal capacitor Clc. In addition, the pixel electrode PE and the portion of storage line STL, which face each other such that the first, second, and third insulating layers 10, 20, and 30 are arranged between the pixel electrode PE and the portion of the storage line STL, form the storage capacitor Cst. The storage line STL is applied with a storage voltage having a level different from that of the pixel voltage. The storage voltage may have the same level as that of the common voltage.

Meanwhile, different from the circuit diagram of the pixel PXij shown in FIG. 3, at least one of the color filter layer CF and the common electrode CE may be arranged on the first substrate DS1. In other words, the liquid crystal display panel according to the present example embodiment may include a vertical alignment (VA) mode pixel, a patterned vertical alignment (PVA) mode pixel, an in-plane switching (IPS) mode pixel, a fringe-field switching (FFS) mode pixel, or a plane-to-line switching (PLS) mode pixel.

Figure 5:
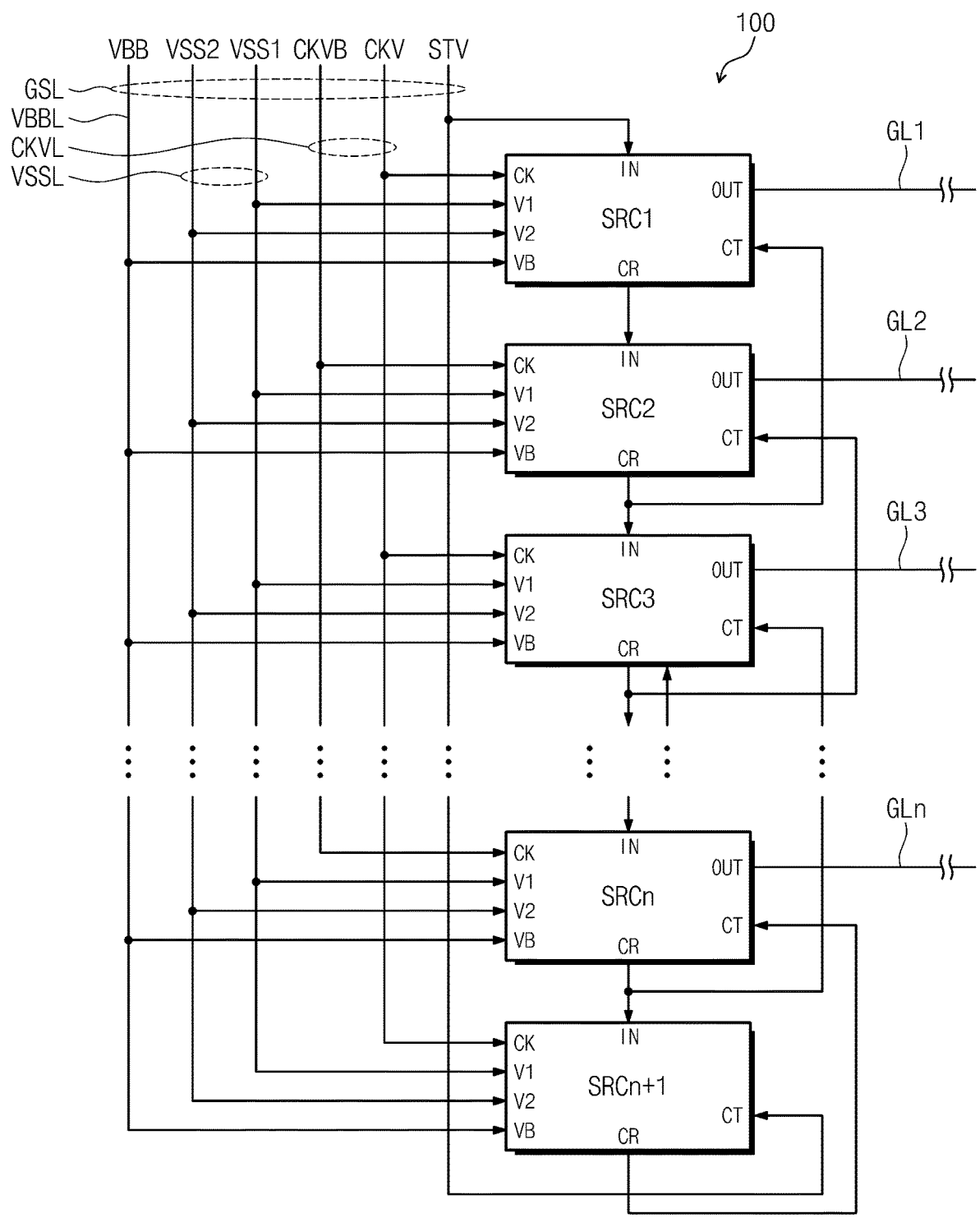
FIG. 5 is a block diagram showing a gate driving circuit according to an example embodiment of the present invention.

FIG. 5 is a block diagram showing a gate driving circuit according to an example embodiment of the present invention. Referring to FIG. 5, the gate driving circuit 100 includes a plurality of driving stages SRC1 to SRCn and a dummy driving stage SRCn+1. The driving stages SRC1 to SRCn and the dummy driving stage SRCn+1 are connected to each other one after another to allow each driving stage to be driven in response to a carry signal output from a previous driving stage and a carry signal output from a next driving stage.

Each of the driving stages SRC1 to SRCn receives a first clock signal CKV, a second clock signal CKVB, a first ground voltage (or first low-level voltage) VSS1, a second ground voltage (or second low-level voltage) VSS2, and a back bias control voltage VBB through a signal line GSL from the driving controller 300 shown in FIG. 1. The driving state SRC1 and the dummy driving stage SRCn+1 further receive a start signal STV. The signal line GSL includes a back bias voltage signal line VBBL transmitting the back bias control voltage VBB, clock signal lines CKVL transmitting the first and second clock signals CKV and CKVB, and ground voltage lines (or low-level voltage lines) VSSL transmitting the first and second ground voltages VSS1 and VSS2.

In the present example embodiment, the driving stages SRC1 to SRCn are connected to the gate lines GL1 to GLn, respectively. The driving stages SRC1 to SRCn apply the gate signals to the gate lines GL1 to GLn, respectively. In the present example embodiment, the gate lines connected to the driving stages SRC1 to SRCn may be odd-numbered gate lines and even-numbered gate lines among the gate lines GL1 to GLn.

Each of the driving stages SRC1 to SRCn and the dummy driving stage SRCn+1 includes an output terminal OUT, a carry terminal CR, an input terminal IN, a control terminal CT, a clock terminal CK, a first ground terminal (or first low-level terminal) V1, a second ground terminal (or second low-level terminal) V2, and a bias voltage terminal VB.

The output terminal OUT of each of the driving stages SRC1 to SRCn is connected to a corresponding gate line of the gate lines GL1 to GLn. The gate signals GS1 to GSn generated by the driving stages SRC1 to SRCn are applied to the gate lines GL1 to GLn through the output terminals OUT.

The carry terminal CR of each of the driving stages SRC1 to SRCn is electrically connected to the input terminal IN of the next driving stage following the corresponding driving stage. The carry terminals CR of each of the driving stages SRC1 to SRCn outputs the carry signal.

The input terminal IN of each of the driving stages SRC1 to SRCn and the dummy stage SRCn+1 receives the carry signal from a previous driving stage prior to the corresponding driving stage. For instance, the input terminal IN of a third driving stage SRC3 receives the carry signal output from a second driving stage SRC2. Among the driving stages SRC1 to SRCn, the input terminal IN of the first driving stage SRC1 receives the start signal STV that starts an operation of the gate driving circuit 100 instead of the carry signal of the previous driving stage.

The control terminal CT of each of the driving stages SRC1 to SRCn is electrically connected to the carry terminal CR of the next driving stage following the corresponding driving stage. The control terminal CT of each of the driving stages SRC1 to SRCn receives the carry signal of the next driving stage following the corresponding driving stage. For instance, the control terminal CT of the second driving stage SRC2 receives the carry signal output from the carry terminal CR of the third driving stage SRC3. In the present example embodiment, the control terminal CT of each of the driving stages SRC1 to SRCn may be electrically connected to the output terminal OUT of the next driving stage following the corresponding driving stage.

The control terminal CT of the driving stage SRCn receives the carry signal output from the carry terminal CR of the dummy stage SRCn+1. The control terminal CT of the dummy stage SRCn+1 receives the start signal STV.

The clock terminal CK of each of the driving stages SRC1 to SRCn receives the first clock signal CKV or the second clock signal CKVB. The clock terminals CK of the odd-numbered driving stages SRC1 and SRC3 among the driving stages SRC1 to SRCn receive the first clock signal CKV. The clock terminals CK of the even-numbered driving stages SRC2 and SRCn among the driving stages SRC1 to SRCn receive the second clock signal CKVB. The first and second clock signals CKV and CKVB have different phases from each other.

The first ground terminal V1 of each of the driving stages SRC1 to SRCn receives a first ground voltage VSS1 and the second ground terminal V2 of each of the driving stages SRC1 to SRCn receives the second ground voltage VSS2. In the present example embodiment, the first and second ground voltages VSS1 and VSS2 have different voltage levels from each other, and the second ground voltage VSS2 has a voltage level lower than that of the first ground voltage VSS1. The first ground voltage VSS1 and the second ground voltage VSS2 may be ground voltages. According to some embodiments, one or both of the first ground voltage VSS1 and the second ground voltage VSS2 may be negative voltages having a negative value.

The bias voltage terminal VB of each of the driving stages SRC1 to SRCn receives the back bias control voltage VBB. The back bias control voltage VBB will be described in more detail below.

In each of the driving stages SRC1 to SRCn according to the present example embodiment, one of the output terminal OUT, the input terminal IN, the carry terminal CR, the control terminal CT, the clock terminal CK, the first ground terminal V1, and the second ground terminal V2 is omitted or another terminal is added to each of the driving stages SRC1 to SRCn. For instance, one of the first and second ground terminals V1 and V2 may be omitted. In addition, a connection relation between the driving stages SRC1 to SRCn may be changed.

Figure 6:
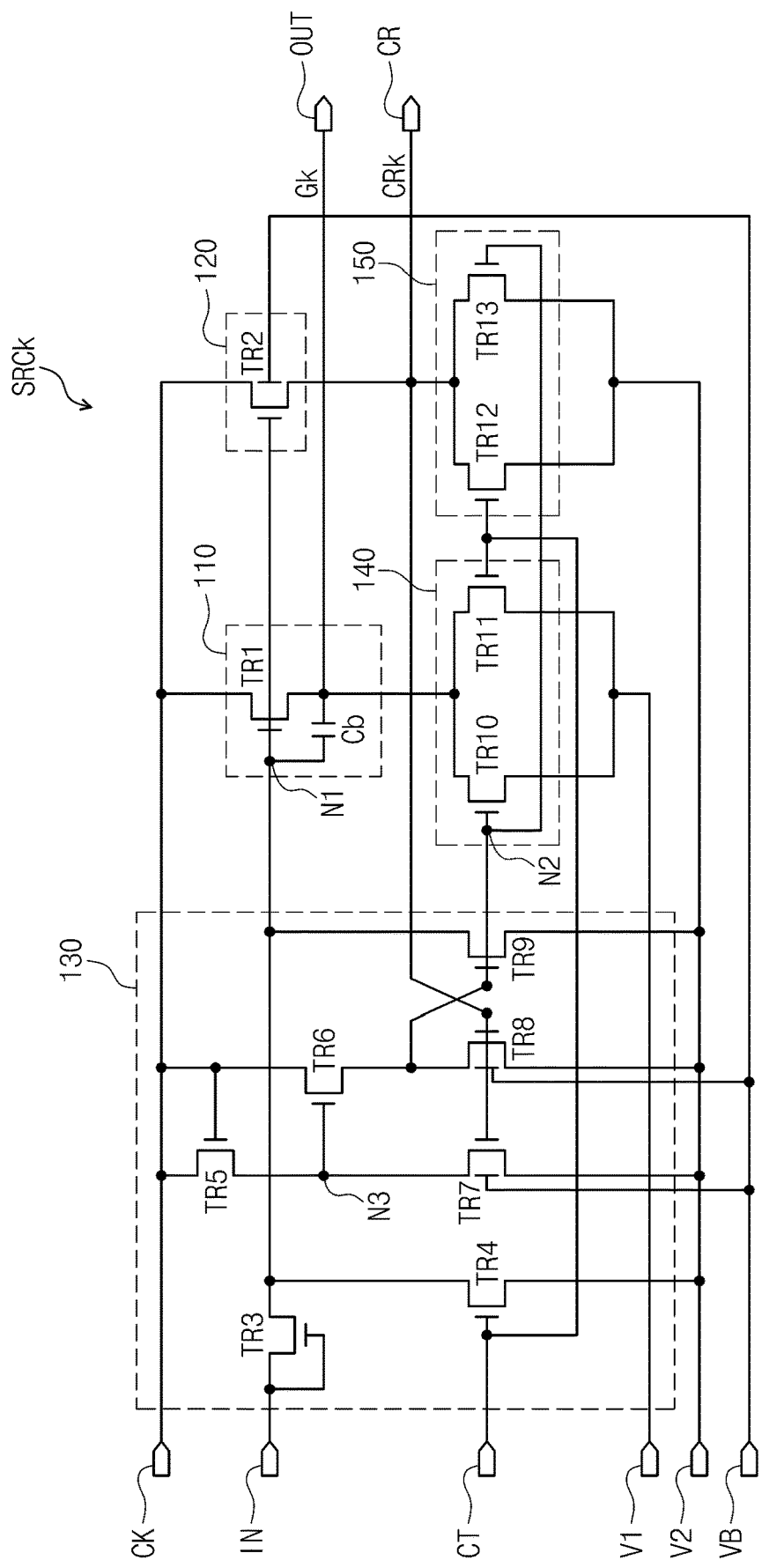
FIG. 6 is a circuit diagram showing a driving stage according to an example embodiment of the present invention.

FIG. 6 is a circuit diagram showing a driving stage according to an example embodiment of the present invention.

FIG. 6 shows a k-th (k is a positive integer number) driving stage SRC3 among the driving stages SRC1 to SRCn shown in FIG. 5. Each of the driving stages SRC1 to SRCn shown in FIG. 5 may have substantially the same circuit diagram as that of the k-th driving stage SRCk.

Referring to FIG. 6, the k-th driving stage SRCk includes a first output part 110, a second output part 120, a control part 130, a first pull-down part 140, and a second pull-down part 150. The first output part 110 outputs a k-th gate signal Gk and the second output part 120 outputs a k-th carry signal CRk. The first pull-down part 140 lowers the output terminal OUT to the first ground voltage VSS1 connected to the first ground terminal V1 and the second output part 150 lowers the carry terminal CR to the second ground voltage VSS2 connected to the second ground terminal V2. The control part 120 controls an operation of the first output part 110, the second output part 120, the first pull-down part 140, and the second pull-down part 150.

The circuit configuration of the k-th driving stage SRCk is as follows.

The first output part 110 includes a first output transistor TR1. The first output transistor TR1 includes an input electrode connected to the clock terminal CK, a control electrode connected to a first node N1, and an output electrode outputting the k-th gate signal Gk.

The second output part 120 includes a second output transistor TR2. The second output transistor TR2 includes an input electrode connected to the clock terminal CK, a control electrode connected to the first node N1, and an output electrode outputting the k-th carry signal CRk.

As shown in FIG. 5, the clock terminal CK of driving stages SRC1, SRC3, . . . , SRCn−1 and the dummy driving stage SRCn+1 among the driving stages SRC1 to SRCn receives the first clock signal CKV. The clock terminal CK of driving stages SRC2, SRC4, . . . , SRCn among the driving stages SRC1 to SRCn receives the second clock signal CKVB. The clock signal CKV and the clock signal CKVB are signals complementary to each other. That is, the clock signal CKV and the clock signal CKVB have a phase difference of about 180 degrees.

The control part 120 turns on the first and second output transistors TR1 and TR2 in response to a (k−1)th carry signal CRk−1 output from the previous driving stage SRCk−1 and applied to the input terminal IN. The control part 120 turns off the first and second output transistors TR1 and TR2 in response to a (k+1)th carry signal CRk+1 output from the next driving stage SRCk+1 and applied to the control terminal CT. The control part 120 controls the first and second pull-down parts 140 and 150 in response to the first clock signal CKV or the second clock signal CKVB provided through the clock terminal CK and the (k+1)th carry signal CRk+1 applied to the control terminal CT.

The control part 120 includes third, fourth, fifth, sixth, seventh, eighth, and ninth transistors TR3, TR4, TR5, TR6, TR7, TR8, and TR9. The third transistor TR3 is connected between the input terminal IN and the first node N1 and includes a control electrode connected to the input terminal IN. The fourth transistor TR4 is connected between the first node N1 and the second ground terminal V2 and includes a control electrode connected to the control terminal CT.

The fifth transistor TR5 is connected between the clock terminal CK and a third node N3 and includes a control electrode connected to the clock terminal CK. The sixth transistor TR6 is connected between the clock terminal CK and the second node N2 and includes a control electrode connected to the third node N3. The seventh transistor TR7 is connected between the third node N3 and the second ground terminal V2 and includes a control electrode connected to the output electrode of the second output transistor TR2. The eighth transistor TR8 is connected between the second node N2 and the second ground terminal V2 and includes a control electrode connected to the output electrode of the second output transistor TR2. The ninth transistor TR9 is connected between the first node N1 and the second ground terminal V2 and includes a control electrode connected to the second node N2.

The first pull-down part 140 includes a tenth transistor TR10 and an eleventh transistor TR11. The tenth transistor TR10 is connected between the output electrode of the first output transistor TR1 and the first ground terminal V1 and includes a control electrode connected to the second node N2. The eleventh transistor TR11 is connected between the output electrode of the first output transistor TR1 and the first ground terminal V1 and includes a control electrode connected to the control terminal CT.

The second pull-down part 150 includes a twelfth transistor TR12 and a thirteenth transistor TR13. The twelfth transistor TR12 is connected between the output electrode of the second output transistor TR2 and the second ground terminal V2 and includes a control electrode connected to the control terminal CT. The thirteenth transistor TR13 is connected between the output electrode of the second output transistor TR2 and the second ground terminal V2 and includes a control electrode connected to the second node N2.

Among the transistors TR1 to TR13 of the driving stage SRCk shown in FIG. 6, each of the second output transistor TR2, the seventh transistor TR7, and the eighth transistor TR8 is a four-terminal transistor that controls a threshold voltage thereof. Each of the second output transistor TR2, the seventh transistor TR7, and the eighth transistor TR8 includes an input electrode, an output electrode, and the control electrode and further includes a bias control electrode. The bias control electrode of each of the second output transistor TR2, the seventh transistor TR7, and the eighth transistor TR8 is connected to the bias voltage terminal VB. In FIG. 6, each of the second output transistor TR2, the seventh transistor TR7, and the eighth transistor TR8 is the four-terminal transistor, but it should not be limited thereto or thereby. That is, according to another example embodiment, at least one of the second output transistor TR2, the seventh transistor TR7, and the eighth transistor TR8 may be the four-terminal transistor. According to another embodiment, at least one or each of the transistors TR1, TR3 to TR6, and TR9 to TR13 may be the four-terminal transistor.

Figure 7:
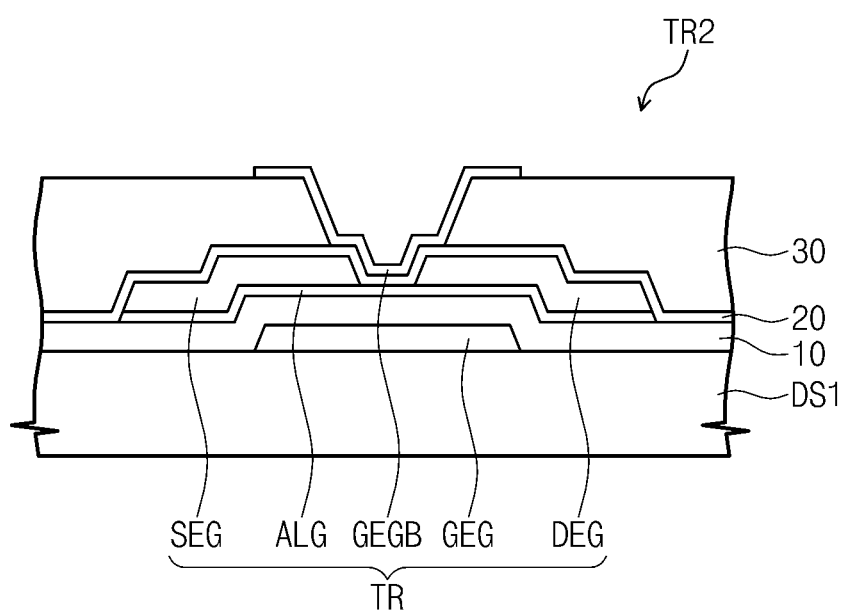
FIG. 7 is a cross-sectional view showing further details of the second output transistor shown in FIG. 6.

FIG. 7 is a cross-sectional view showing the second output transistor TR2 shown in FIG. 6. The seventh and eighth transistors TR7 and TR8 have the same structure as that of the second output transistor TR2 shown in FIG. 7.

Referring to FIG. 7, the second output transistor TR2 includes the control electrode GEG connected to the first node N1, an active part ALG overlapped with the control electrode GEG, the input electrode SEG connected to the clock terminal CK, and the output electrode DEG spaced apart from the input electrode SEG.

The second output transistor TR2 is arranged on the same first substrate DS1 as the pixel transistor TR described with reference to FIG. 4. The first insulating layer 10 is disposed on the first substrate DS1 to cover the control electrode GEG and the storage line STL. The first insulating layer 10 includes at least one of the inorganic material and the organic material. The first insulating layer 10 is the organic or inorganic layer. The first insulating layer 10 has the multi-layer structure of the silicon nitride layer and the silicon oxide layer.

The active part ALG is arranged on the first insulating layer 10 to overlap with the control electrode GEG. The active part ALG includes a semiconductor layer and an ohmic contact layer. The semiconductor layer is arranged on the first insulating layer 10, and the ohmic contact layer is arranged on the semiconductor layer.

The output electrode DEG and the input electrode SEG are arranged on the active part ALG. The output electrode DEG and the input electrode SEG are spaced apart from each other. Each of the output electrode DEG and the input electrode SEG is partially overlapped with the control electrode GEG.

The second insulating layer 20 is arranged on the first insulating layer 10 to cover the active part ALG, the output electrode DEG, and the input electrode SEG. The second insulating layer 20 includes the inorganic or organic material. The second insulating layer 20 is the organic or inorganic layer. The second insulating layer 20 has the multi-layer structure of the silicon nitride layer and the silicon oxide layer.

The third insulating layer 30 is arranged on the second insulating layer 20.

The third insulating layer 30 provides an evenness (e.g., smooth, level, or planar) surface. The third insulating layer 30 includes the organic material.

A back gate electrode GEGB is arranged on the third insulating layer 30. The threshold voltage of the second output transistor TR2 may be changed in accordance with the back bias control voltage VBB applied to the back gate electrode GEGB.

Figure 8:
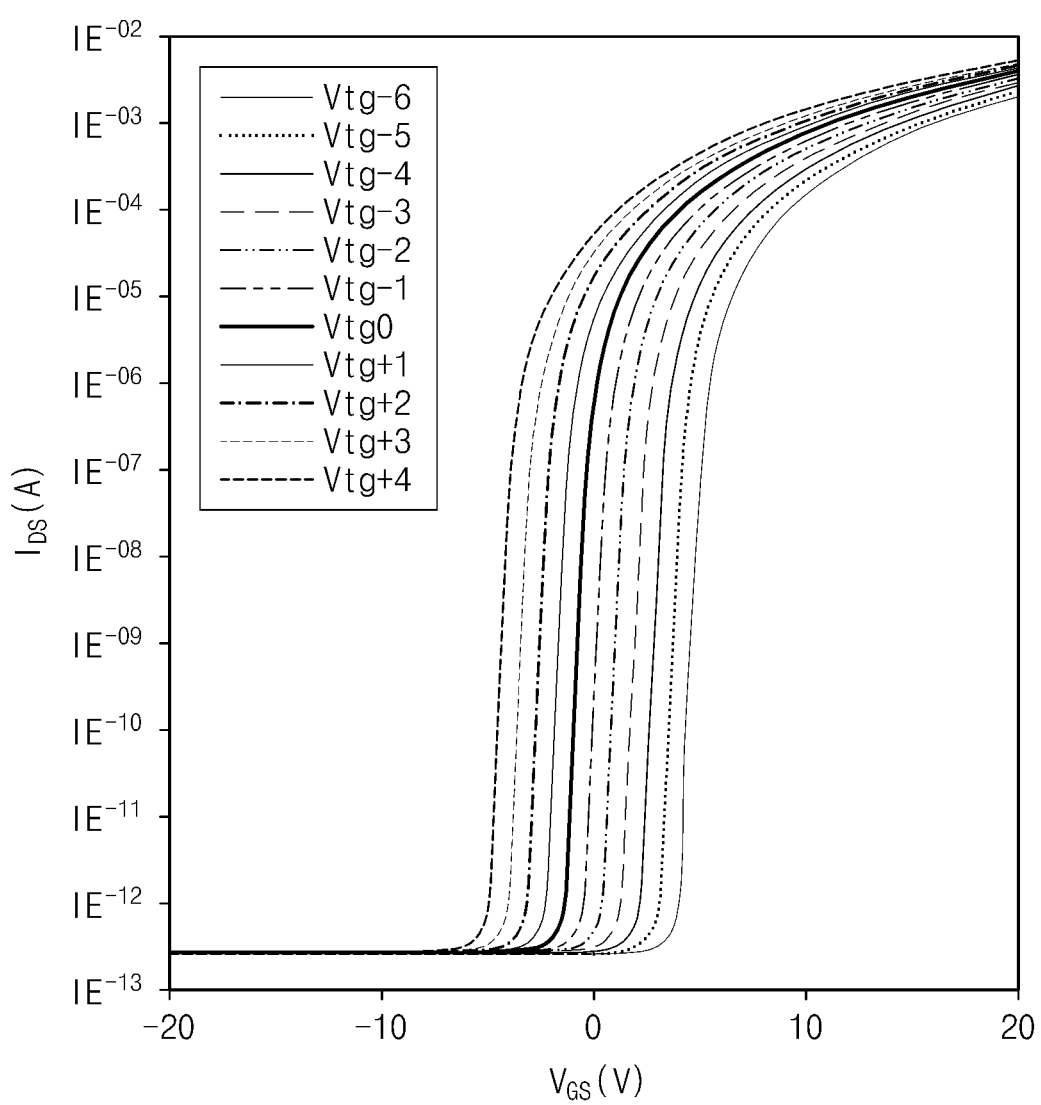
FIG. 8 is a graph showing a variation of a threshold voltage as a function of a bias voltage applied to a back gate electrode of the second output transistor shown in FIG. 7.

FIG. 8 is a graph showing a variation of the threshold voltage as a function of the bias voltage applied to the back gate electrode GEGB of the second output transistor TR2 shown in FIG. 7.

Referring to FIG. 8, as the voltage level of the back bias control voltage VBB applied to the back gate electrode of the second output transistor TR2 becomes lower than a reference voltage Vtg, the threshold voltage of the second output transistor TR2 is positive-shifted. In addition, as the voltage level of the back bias control voltage VBB applied to the back gate electrode of the second output transistor TR2 becomes higher than the reference voltage Vtg, the threshold voltage of the second output transistor TR2 is negative-shifted.

When the gate driving circuit 100 mounted on the non-display area NDA of the display panel DP shown in FIG. 1 in the OSG form is driven for a long time, the threshold voltage of the transistors TR1 to TR12 shown in FIG. 6 is negative-shifted. In particular, the variation in threshold voltage of the second output transistor TR2, the seventh transistor TR7, and the eighth transistor TR8 exerts influence on the operation of the k-th driving state SRCk. Therefore, when the threshold voltage of each of the second output transistor TR2, the seventh transistor TR7, and the eighth transistor TR8 is negative-shifted, the back bias control voltage VBB is required to be lower than the reference voltage Vtg.

Figure 9:
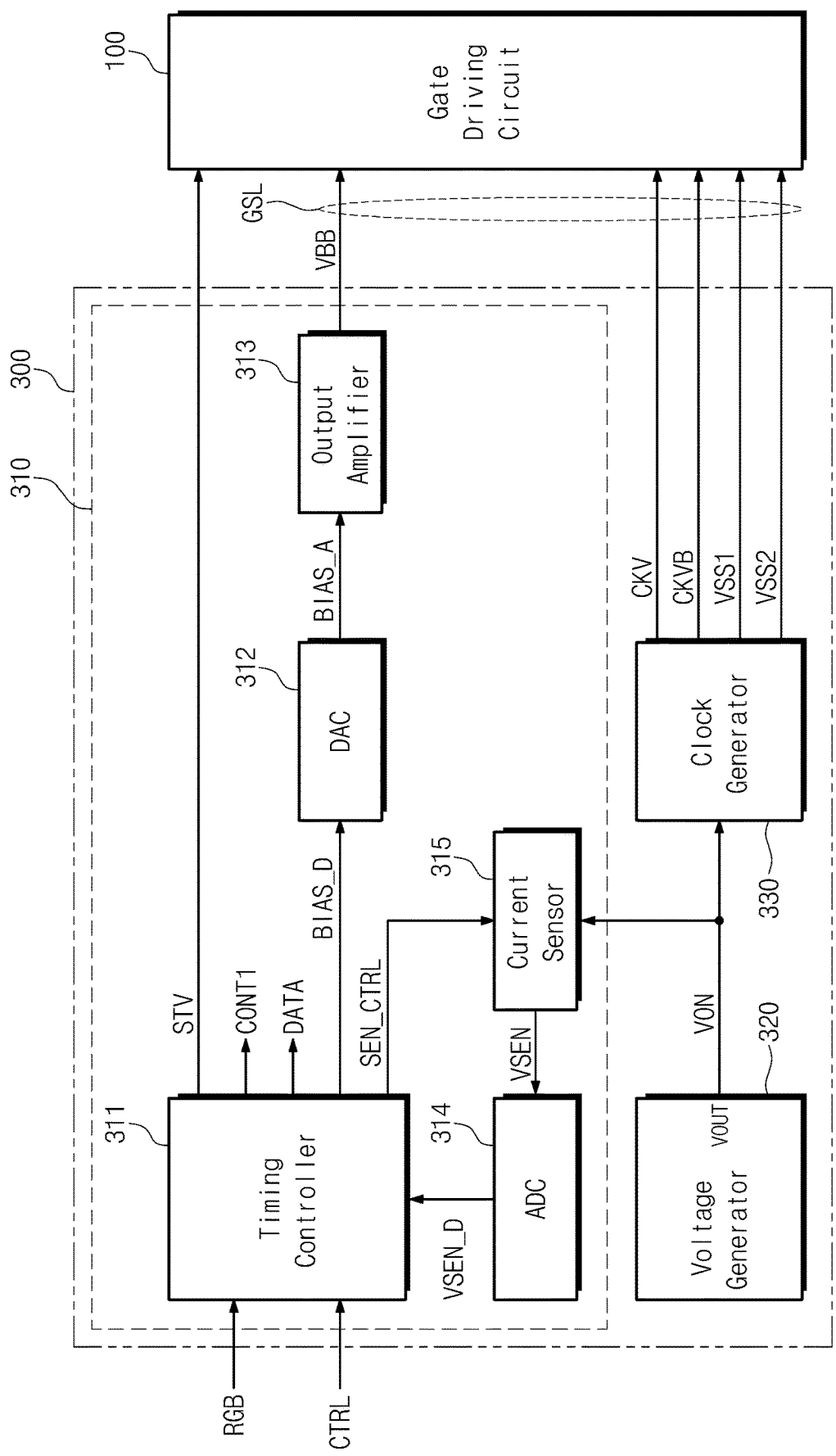
FIG. 9 is a block diagram showing further details of the driving controller shown in FIG. 1.

FIG. 9 is a block diagram showing the driving controller 300 shown in FIG. 1.

Referring to FIG. 9, the driving controller 300 includes a signal controller 310, a voltage generator 320, and a clock generator 330. The voltage generator 320 outputs a gate-on voltage VON through a voltage output terminal VOUT thereof. The clock generator 330 receives the gate-on voltage VON from the voltage generator 320 and generates the first clock signal CKV, the second clock signal CKVB, the first ground voltage VSS1, and the second ground voltage VSS2. The first clock signal CKV, the second clock signal CKVB, the first ground voltage VSS1, and the second ground voltage VSS2 generated by the clock generator 330 are applied to the gate driving circuit 100. Each of the first and second clock signals CKV and CKVB generated by the clock generator 330 may be a pulse signal swung between the gate-on voltage VON and the second ground voltage VSS2. For instance, the gate-on voltage is about 10 volts, the second ground voltage VSS2 is about −16 volts, and the first ground voltage VSS1 is about −13 volts.

The signal controller 310 senses a variation in current of the voltage output terminal VOUT and generates the back bias control voltage VBB corresponding to the sensed current variation. The signal controller 310 includes a timing controller 311, a digital-to-analog converter 312, an output amplifier 313, an analog-to-digital converter 314, and a current sensor 315.

The timing controller 311 receives image signals RGB and control signals CTRL from an external source. The control signals CTRL include the vertical synchronization signal, the horizontal synchronization signal, the main clock signal, and the data enable signal, etc. The timing controller 311 processes the image signals RGB on the basis of the control signals CTRL, applies a data signal DATA, which are appropriate to an operation condition of the display panel 110, and a first control signal CONT1 to the data driving circuit 200 shown in FIG. 1, and applies the start signal STV to the gate driving circuit 100 shown in FIG. 1. The first control signal CONT1 includes a horizontal synchronization start signal, a clock signal, and a line latch signal. The timing controller 311 may change the data signal in accordance with the arrangement of the pixels $PX_{11}$ to $PX_{nm}$ of the display panel 110 and a display frequency of the display panel 110. The timing controller 311 further outputs a sensing control signal SEN_CTRL.

The current sensor 315 senses the current variation of the voltage output terminal in response to the sensing control signal SEN_CTRL from the timing controller 311 and outputs a sensing voltage VSEN corresponding to the sensed current variation.

The analog-to-digital converter 314 converts the sensing voltage VSEN from the current sensor 315 to a digital sensing signal VSEN_D and applies the digital sensing signal VSEN_D to the timing controller 311. The timing controller 311 outputs a bias voltage signal BIAS_D corresponding to the digital sensing signal VSEN_D. The timing controller 311 includes a register, a look-up table, and a memory to store the bias voltage signal BIAS_D corresponding to the digital sensing signal VSEN_D.

The timing controller 311 outputs the bias voltage signal BIAS_D corresponding to the digital sensing signal VSEN_D applied thereto at a time point at which a time (e.g., a predetermined time) elapses after the sensing control signal SEN_CTRL is output. The timing controller 311 outputs the bias voltage signal BIAS_D corresponding to the reference voltage Vtg0 shown in FIG. 8 at the beginning of the operation thereof.

The digital-to-analog converter 312 converts the bias voltage signal BIAS_D provided from the timing controller 311 to an analog bias voltage signal BIAS_A. The output amplifier 313 amplifies the analog bias voltage signal BIAS_A to output the back bias control voltage VBB.

Figure 10:
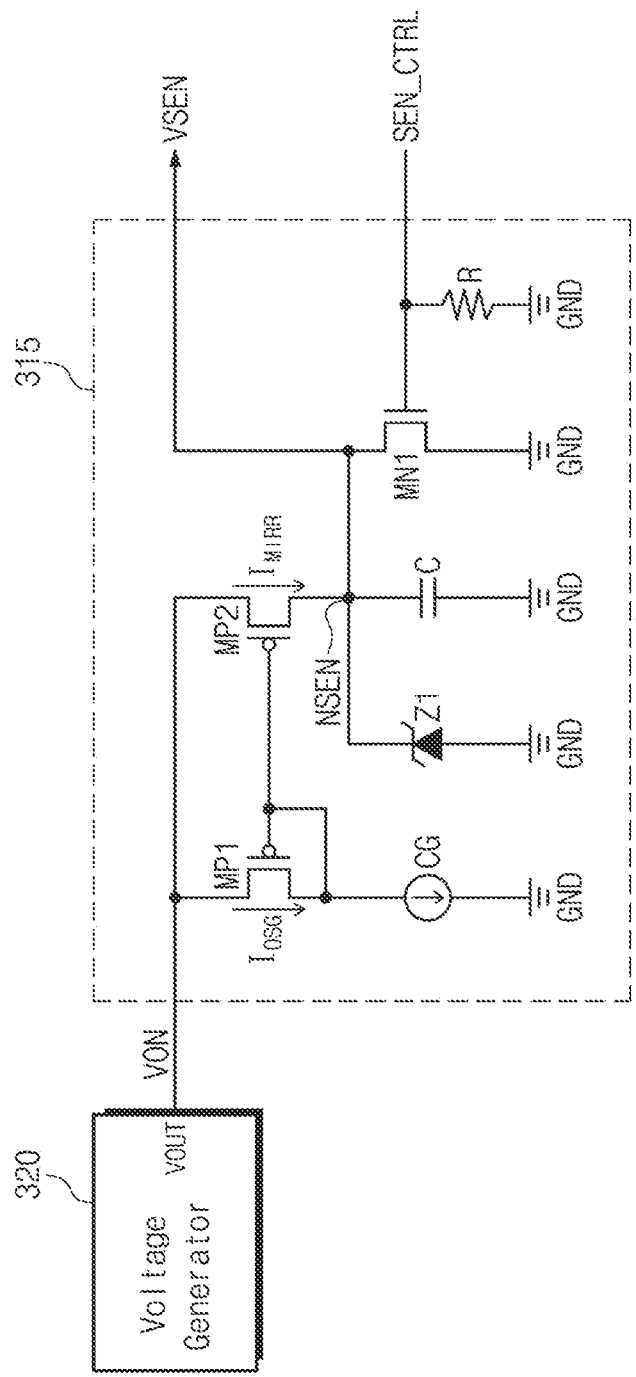
FIG. 10 is a circuit diagram showing further details of the current sensor shown in FIG. 9.

FIG. 10 is a circuit diagram showing the current sensor 315 shown in FIG. 9.

Referring to FIG. 10, the current sensor 315 includes transistors MP1, MP2, and MN1, a capacitor C, a resistor R, a zener diode Z1, and a current source CG, which is grounded. The transistor MP1 is connected between the gate-on voltage VON and the current source CG. The transistor MP2 is connected between the gate-on voltage VON and a sensing node NSEN. A control electrode of the transistor MP1 and a control electrode of the transistor MP2 are commonly connected to one end of the current source CG.

The zener diode Z1 is connected between the sensing node NSEN and the ground voltage. The capacitor C is connected between the sensing node NSEN and the ground voltage. The transistor MN1 is connected between the sensing node NSEN and the ground voltage and includes a control electrode connected to the sensing control signal SEN_CTRL. The resistor R is connected between the control electrode of the transistor MN1 and the ground voltage.

Figure 11:
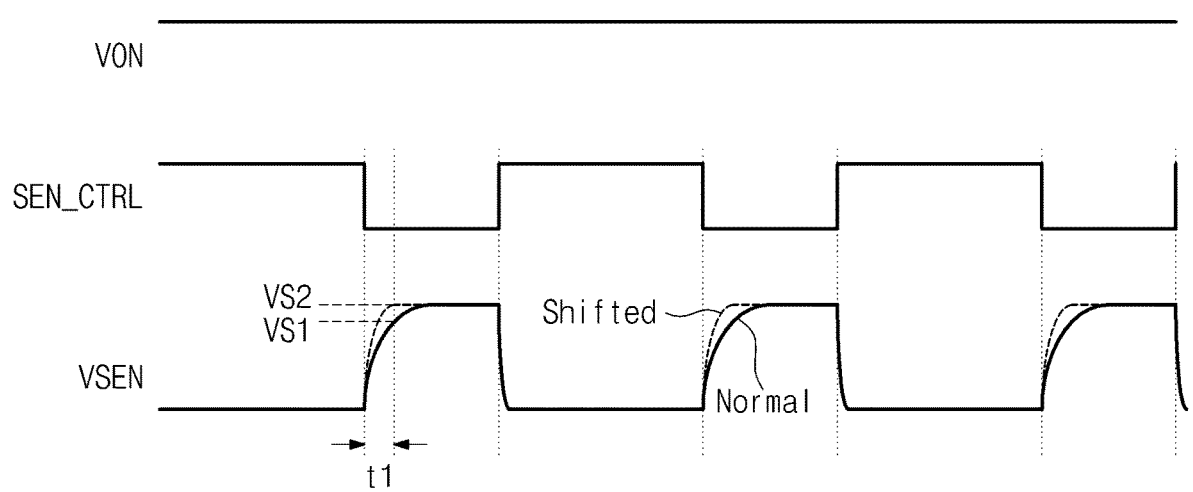
FIG. 11 is a timing diagram showing further details of the operation of the current sensor shown in FIG. 10.

FIG. 11 is a timing diagram showing further details of an operation of the current sensor 315 shown in FIG. 10.

Referring to FIGS. 9, 10, and 11, the timing controller 311 outputs the sensing control signal SEN_CTRL that periodically transits to a low level. The voltage generator 320 outputs the gate-on voltage VON through the output terminal VOUT thereof. The gate-on voltage VON output from the voltage generator 320 is maintained at a level (e.g., at a predetermined level).

As described with reference to FIGS. 6 and 7, the threshold voltage of the transistors TR1 to TR13 is negative-shifted when the gate driving circuit 100 is driven at a high temperature for a long time. When the threshold voltage of the transistors TR1 to TR13 is negative-shifted, a gate-source voltage $V_{GS}$ at which the transistors TR1 to TR13 are turned on is lowered, and thus an amount of leakage current flowing from the clock terminal CK to the first ground terminal V1 or the second ground terminal V2 through the transistors TR1 to TR13 increases.

Due to the increase of the leakage current in the gate driving circuit 100, the amount of the current output through the voltage output terminal VOUT of the voltage generator 320 increases. Thus, the signal controller 310 may check that whether the threshold voltage of the transistors TR1 to TR13 in the gate driving circuit 100 is shifted by sensing the variation of the current output through the voltage output terminal VOUT of the voltage generator 320.

Referring to FIGS. 10 and 11 again, when the gate-on voltage VON is provided at a level (e.g., at a predetermined level), an amount of a current $I_{OSG}$ flowing through the transistor MP1 is substantially the same as an amount of a current $I_{MIRR}$ flowing through the transistor MP2. When the sensing control signal SEN_CTRL is at a high level, the transistor MN1 is turned on and the voltage of the sensing node NSEN is discharged to the ground voltage GND. Accordingly, the sensing voltage VSEN is maintained in the ground voltage GND during a time in which the sensing control signal SEN_CTRL is at the high level.

When the sensing control signal SEN_CTRL is transited to the low level, the transistor MN1 is turned off. In this case, an increasing speed of the voltage of the sensing node NSEN is determined depending on the amount of the current $I_{MIRR}$ flowing through the transistor MP2. For instance, when the threshold voltage of the transistors TR1 to TR13 shown in FIG. 6 is in a normal range, the sensing voltage VSEN increases from the ground voltage GND with a slope represented by a solid line in FIG. 11.

When the threshold voltage of the transistors TR1 to TR13 is negative-shifted, the amount of the current $I_{MIRR}$ flowing through the transistor MP2, and thus the sensing voltage VSEN increases from the ground voltage GND with a slope represented by a dotted line in FIG. 11. That is, as the amount of the current output from the voltage output terminal VOUT of the voltage generator 320 increases, the increasing speed of the sensing voltage VSEN becomes faster. When a time (e.g., a predetermined time) t1 elapses after the sensing control signal SEN_CTRL is transited to the low level, the voltage level of the sensing voltage VSEN is determined depending on that whether the threshold voltage of the transistors TR1 to TR13 is shifted or not. For instance, when the voltage level of the sensing voltage VSEN is a first level VS1 lower than the reference level, it is determined whether or not the threshold voltage of the transistors TR1 to TR13 is within the normal range. When the voltage level of the sensing voltage VSEN is a second level VS2 higher than the reference level, it is determined whether or not the threshold voltage of the transistors TR1 to TR13 is negative-shifted.

The timing controller 311 shown in FIG. 9 may check that whether the threshold voltage of the transistors TR1 to TR13 is shifted in response to the digital sensing signal VSEN_D applied thereto when the amount of time (e.g., the predetermined amount of time) t1 elapses after the sensing control signal SEN_CTRL is transited to the low level. When the digital sensing signal VSEN_D is not within the normal range, the timing controller 311 outputs the bias voltage signal BIAS_D such that the threshold voltage of the transistors TR1 to TR13 is shifted to a normal range (e.g., a predetermined normal range). The back bias control voltage VBB is applied to the gate driving circuit 100 by the digital-to-analog converter 312 and the output amplifier 313.

Referring to FIG. 6 again, the second, seventh, and eighth transistors TR2, TR7, and TR8 shift the threshold voltage in response to the back bias control voltage VBB applied to the back gate electrode. Accordingly, the threshold voltage of the second, seventh, and eighth transistors TR2, TR7, and TR8, which is negative-shifted when the gate driving circuit 100 is driven at the high temperature for a long time, may be returned to the normal range. Therefore, reliability of the gate driving circuit 100 may be improved.

Figure 12:
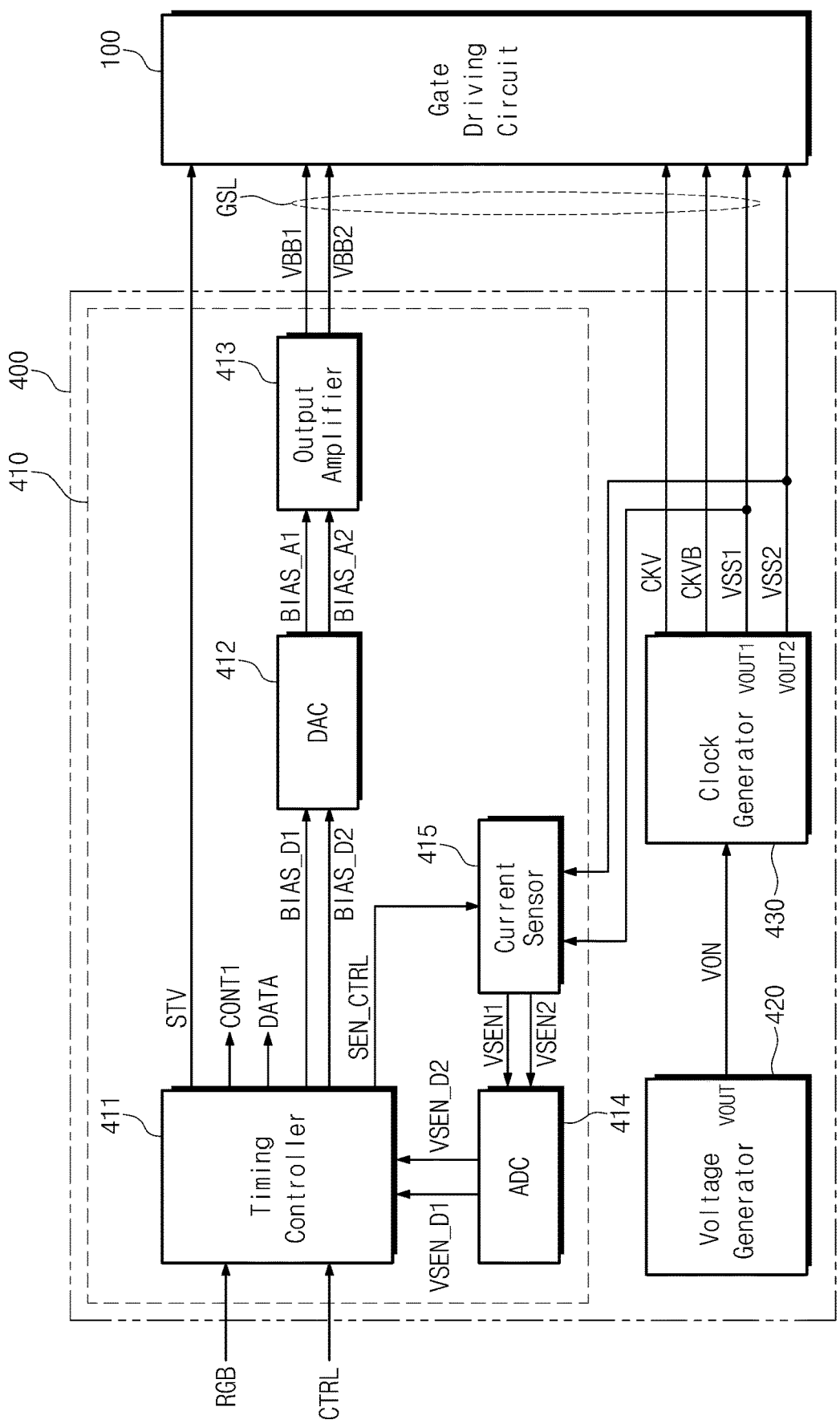
FIG. 12 is a block diagram showing further details of the driving controller shown in FIG. 1 according to an example embodiment of the present invention.

FIG. 12 is a block diagram showing a driving controller 400 according to another example embodiment of the present invention.

Referring to FIG. 12, the driving controller 400 includes a signal controller 410, a voltage generator 420, and a clock generator 430. The voltage generator 420 outputs a gate-on voltage VON through a voltage output terminal VOUT thereof. The clock generator 430 receives the gate-on voltage VON from the voltage generator 420 and generates a first clock signal CKV, a second clock signal CKVB, a first ground voltage VSS1, and a second ground voltage VSS2. The first clock signal CKV, the second clock signal CKVB, the first ground voltage VSS1, and the second ground voltage VSS2 generated by the clock generator 430 are applied to the gate driving circuit 100. Each of the first and second clock signals CKV and CKVB generated by the clock generator 430 may be a pulse signal swung between the gate-on voltage VON and the second ground voltage VSS2. For instance, the gate-on voltage is about 10 volts, the second ground voltage VSS2 is about −16 volts, and the first ground voltage VSS1 is about −13 volts.

The signal controller 410 senses a variation in current of the voltage output terminal VOUT and generates a first back bias control voltage VBB1 and a second back bias control voltage VBB2, which correspond to the sensed current variation. The signal controller 410 includes a timing controller 411, a digital-to-analog converter 412, an output amplifier 413, an analog-to-digital converter 414, and a current sensor 415.

The timing controller 411 receives image signals RGB and control signals CTRL from an external source. The control signals CTRL include the vertical synchronization signal, the horizontal synchronization signal, the main clock signal, and the data enable signal, etc. The timing controller 411 processes the image signals RGB on the basis of the control signals CTRL, applies a data signal DATA, which are appropriate to an operation condition of the display panel 110, and a first control signal CONT1 to the data driving circuit 200 shown in FIG. 1, and applies the start signal STV to the gate driving circuit 100 shown in FIG. 1. The first control signal CONT1 includes a horizontal synchronization start signal, a clock signal, and a line latch signal. The timing controller 411 may change the data signal in accordance with the arrangement of the pixels $PX_{11}$ to $PX_{nm}$ of the display panel 110 and a display frequency of the display panel 110. The timing controller 411 further outputs a sensing control signal SEN_CTRL.

The current sensor 415 senses the current variation of first and second voltage output terminals VOUT1 and VOUT2 of the clock generator 430 in response to the sensing control signal SEN_CTRL from the timing controller 411 and outputs a first sensing voltage VSEN1 and a second sensing voltage VSEN2, which correspond to the sensed current variation.

The analog-to-digital converter 414 converts the first and second sensing voltages VSEN1 and VSEN2 from the current sensor 415 to a first digital sensing signal VSEN_D1 and a second digital sensing signal VSEN_D2, respectively, and applies the first and second digital sensing signals VSEN_D1 and VSEN_D2 to the timing controller 411. The timing controller 411 outputs a first bias voltage signal BIAS_D1 and a second bias voltage signal BIAS_D2, which respectively correspond to the first and second digital sensing signals VSEN_D1 and VSEN_D2. The timing controller 411 includes a register, a look-up table, and a memory to store the first and second bias voltage signals BIAS_D1 and BIAS_D2, which respectively correspond to the first and second digital sensing signal VSEN_D1 and VSEN_D2.

The timing controller 411 outputs the first and second bias voltage signals BIAS_D1 and BIAS_D2 respectively corresponding to the first and second digital sensing signals VSEN_D1 and VSEN_D2 applied thereto at a time point at which a time (e.g., a predetermined time) elapses after the sensing control signal SEN_CTRL is output.

The digital-to-analog converter 412 converts the first and second bias voltage signals BIAS_D1 and BIAS_D2 provided from the timing controller 411 to a first analog bias voltage signal BIAS_A1 and a second analog bias voltage signal BIAS_A2. The output amplifier 413 amplifies the first and second analog bias voltage signals BIAS_A1 and BIAS_A2 to output the first and second back bias control voltages VBB1 and VBB2.

Figure 13:
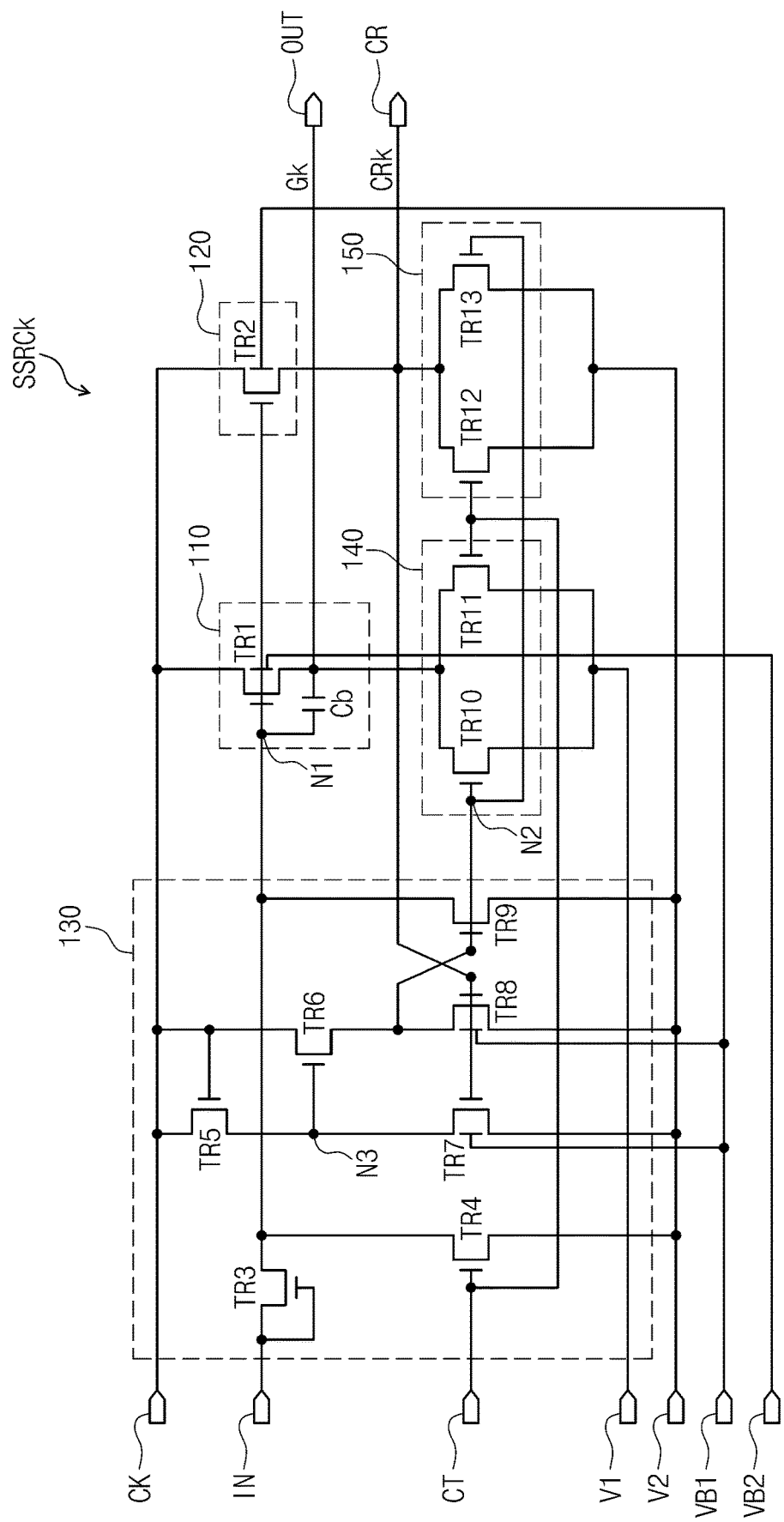
FIG. 13 is a circuit diagram showing a driving stage according to an example embodiment of the present invention.

FIG. 13 is a circuit diagram showing a driving stage SSRCk according to another example embodiment of the present invention.

The driving stage SSRCk shown in FIG. 13 has the same circuit configuration as that of the driving stage SRCk shown in FIG. 6 except for the number of the bias voltage terminals. The driving stage SRCk shown in FIG. 6 includes one bias voltage terminal VB, but the driving stage SSRCk shown in FIG. 13 includes a first bias voltage terminal VB1 and a second bias voltage terminal VB2. In addition, in the driving stage SSRCk shown in FIG. 13, the first output transistor TR1 is the four-terminal transistor in addition to the second, seventh, and eighth transistors TR2, TR7, and TR8.

The threshold voltage of the first output transistor TR1 connected to the first ground terminal V1 applied with the first ground voltage VSS1 is changed depending on the first back bias control voltage VBB1 provided through the first bias voltage terminal VB1. The threshold voltage of the second output transistor TR2, the seventh transistor TR7, and the eighth transistor TR8, which are connected to the second ground terminal V2 applied with the second ground voltage VSS2, is changed depending on the second back bias control voltage VBB2 provided through the second bias voltage terminal VB2.

The signal controller 410 shown in FIG. 12 senses the current variation of the first voltage output terminal VOUT1 and outputs the first back bias control voltage VBB1 corresponding to the sensed current variation. In addition, the signal controller 410 senses the current variation of the second voltage output terminal VOUT2 and outputs the second back bias control voltage VBB2 corresponding to the sensed current variation.

That is, the threshold voltage of the first output transistor TR1 connected to the first ground voltage VSS1 is set depending on the current variation of the first voltage output terminal VOUT1, and the threshold voltage of the second output transistor TR2, the seventh transistor TR7, and the eighth transistor TR8 connected to the second ground voltage VSS2 is set depending on the current variation of the second voltage output terminal VOUT2. As described above, the threshold voltages of the transistors connected to different ground voltages are independently set, and thus the reliability of the driving stage SSRCk is improved.

Although some example embodiments of the present invention have been described, it is understood that the present invention should not be limited to these example embodiments but various changes and modifications can be made by one ordinary skilled in the art within the spirit and scope of the present invention as defined in the following claims, and their equivalents.

What is claimed is:

1. A display apparatus comprising:
a display panel comprising a plurality of pixels respectively connected to a plurality of gate lines;
a voltage generator configured to output a gate-on voltage through a voltage output terminal thereof;
a clock generator configured to receive the gate-on voltage and comprising a clock output terminal configured to output at least one clock signal and a first low-level voltage output terminal configured to output a first low-level voltage;
a gate driving circuit comprising a plurality of driving stages each configured to receive the at least one clock signal and the first low-level voltage to apply gate signals to the gate lines; and
a signal controller comprising:
a current sensor configured to sense a variation in current of the first low-level voltage output terminal in response to an active level of a sensing control signal;
a timing controller configured to output a bias voltage signal based on the sensed current variation, and configured to supply the sensing control signal, which periodically transits to the active level, to the current sensor;
a digital-to-analog converter configured to receive the bias voltage signal from the timing controller and to convert the bias voltage signal to an analog bias voltage signal; and
an output amplifier configured to convert the analog bias voltage signal to a back bias control voltage,
wherein each of the driving stages comprises a plurality of oxide thin film transistors and at least one of the oxide thin film transistors is a four-terminal transistor in which a threshold voltage thereof is controlled by the back bias control voltage.

2. The display apparatus of claim 1, wherein the sensing control signal is periodically activated, and the current sensor is configured to output a sensing voltage corresponding to the sensed current variation in synchronization with the sensing control signal.

3. The display apparatus of claim 2, wherein the timing controller is configured to output the bias voltage signal in response to a digital sensing signal applied thereto when a predetermined time elapses after the sensing control signal.

4. The display apparatus of claim 1, wherein the clock generator comprises a second low-level voltage output terminal configured to output a second low-level voltage.

5. The display apparatus of claim 4, wherein the current sensor is configured to sense a variation in current of the second low-level voltage output terminal.

6. The display apparatus of claim 5, wherein the bias voltage signal comprises a first bias voltage signal output based on the sensed current variation of the first low-level voltage output terminal, and a second bias voltage signal output based on the sensed current variation of the second low-level voltage output terminal.

7. The display apparatus of claim 6, wherein the back bias control voltage comprises a first back bias control voltage output based on the first bias voltage signal and a second back bias control voltage output based on the second bias voltage signal.

8. A display apparatus comprising:
a display panel comprising a plurality of pixels respectively connected to a plurality of gate lines;
a voltage generator configured to output a gate-on voltage through a voltage output terminal thereof;
a clock generator configured to receive the gate-on voltage and comprising a clock output terminal configured to output at least one clock signal and a first low-level voltage output terminal configured to output a first low-level voltage;
a gate driving circuit comprising a plurality of driving stages each configured to receive the at least one clock signal and the first low-level voltage to apply gate signals to the gate lines; and
a signal controller comprising:
a current sensor configured to sense a current variation of the first low-level voltage output terminal and to output a sensing voltage corresponding to the sensed current variation;
an analog-to-digital converter configured to convert the sensing voltage to a digital sensing signal;
a timing controller configured to output a bias voltage signal in response to the digital sensing signal;
a digital-to-analog converter configured to convert the bias voltage signal to an analog bias voltage signal; and
an output amplifier configured to convert the analog bias voltage signal to a back bias control voltage,
wherein each of the driving stages comprises a plurality of oxide thin film transistors and at least one of the oxide thin film transistors is a four-terminal transistor in which a threshold voltage thereof is controlled by the back bias control voltage.

9. The display apparatus of claim 1, wherein the timing controller is further configured to output a sensing control signal, which is periodically activated, and the current sensor is configured to output the sensing voltage in synchronization with the sensing control signal.

10. The display apparatus of claim 9, wherein the timing controller is configured to output the bias voltage signal in response to the digital sensing signal applied thereto when a predetermined time elapses after the sensing control signal.

11. The display apparatus of claim 1, wherein the clock generator comprises a second low-level voltage output terminal configured to output a second low-level voltage.

12. The display apparatus of claim 11, wherein the current sensor is configured to sense a variation in current of the second low-level voltage output terminal.

13. The display apparatus of claim 12, wherein the bias voltage signal comprises a first bias voltage signal output based on the sensed current variation of the first low-level voltage output terminal, and a second bias voltage signal output based on the sensed current variation of the second low-level voltage output terminal.

14. The display apparatus of claim 13, wherein the back bias control voltage comprises a first back bias control voltage output based on the first bias voltage signal and a second back bias control voltage output based on the second bias voltage signal.

\* \* \* \* \*

UNITED STATES PATENT AND TRADEMARK OFFICE
CERTIFICATE OF CORRECTION

| | |
|---|---|
| PATENT NO. | : 11,176,870 B2 |
| APPLICATION NO. | : 16/206950 |
| DATED | : November 16, 2021 |
| INVENTOR(S) | : Soo-wan Yoon et al. |

It is certified that error appears in the above-identified patent and that said Letters Patent is hereby corrected as shown below:

In the Claims

| | |
|---|---|
| Column 20, Line 65, Claim 9 | Delete "claim 1," and Insert -- claim 8, -- |
| Column 21, Line 7, Claim 11 | Delete "claim 1," and Insert -- claim 8, -- |

Signed and Sealed this
Nineteenth Day of December, 2023

Katherine Kelly Vidal
*Director of the United States Patent and Trademark Office*